United States Patent
Ojha et al.

(10) Patent No.: US 11,469,586 B2
(45) Date of Patent: Oct. 11, 2022

(54) OVER-CURRENT PROTECTION CIRCUIT

(71) Applicant: TEXAS INSTRUMENTS INCORPORATED, Dallas, TX (US)

(72) Inventors: Ashish Ojha, Bengaluru (IN); Krishnamurthy Shankar, Bengaluru (IN); Divyasree J, Bengaluru (IN); Siddhartha Gopal Krishna, Bengaluru (IN); Sarangan Thirumavalavan, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 84 days.

(21) Appl. No.: 16/862,674

(22) Filed: Apr. 30, 2020

(65) Prior Publication Data

US 2020/0389008 A1    Dec. 10, 2020

(30) Foreign Application Priority Data

Jun. 4, 2019   (IN) .............................. 201941022077

(51) Int. Cl.
| | |
|---|---|
| H02H 3/00 | (2006.01) |
| H02H 3/08 | (2006.01) |
| H03K 5/24 | (2006.01) |
| H02H 1/00 | (2006.01) |

(52) U.S. Cl.
CPC ............ *H02H 3/08* (2013.01); *H02H 1/0007* (2013.01); *H03K 5/24* (2013.01)

(58) Field of Classification Search
CPC ........... H02H 3/08; H02H 1/0007; H03K 5/24
USPC ......................................................... 361/86
See application file for complete search history.

(56) References Cited

U.S. PATENT DOCUMENTS

| | | | | | |
|---|---|---|---|---|---|
| 4,760,293 | A * | 7/1988 | Hebenstreit | .......... | H03K 17/107 327/432 |
| 8,018,213 | B2 * | 9/2011 | Arndt | .................. | H03K 17/122 323/275 |
| 8,233,257 | B2 * | 7/2012 | Hasegawa | ............... | G05F 1/573 361/93.9 |
| 2012/0098517 | A1 * | 4/2012 | Esumi | ...................... | H02H 3/08 323/311 |
| 2014/0152280 | A1 * | 6/2014 | Spalding, Jr. | ........ | H03K 17/122 323/277 |
| 2015/0280425 | A1 * | 10/2015 | Kreuter | .................. | H02H 3/087 361/93.1 |
| 2019/0288501 | A1 * | 9/2019 | Yanase | ................... | H02H 3/085 |

* cited by examiner

*Primary Examiner* — Jared Fureman
*Assistant Examiner* — Lucy M Thomas
(74) *Attorney, Agent, or Firm* — John R. Pessetto; Charles A. Brill; Frank D. Cimino

(57) ABSTRACT

A circuit includes a first transistor, a second transistor, and a sense transistor. The first current terminals of the first and second transistors are coupled together at a power supply node. The control terminals of the second and third transistors are coupled together. The second current terminals of the first, second, and third transistors are coupled together. The sense resistor is coupled between the first current terminals of the first and second transistors and the first current terminal of the third transistor. The first and second transistors are configured such that during a first mode of operation, current to a load flows through the first and second transistors, and during a second mode of operation, current to a load is discontinued through the first transistor yet flows through the second transistor.

20 Claims, 3 Drawing Sheets

OVER-CURRENT PROTECTION CIRCUIT

CROSS-REFERENCE TO RELATED APPLICATIONS

This application claim priority to India Provisional Application No. 201941022077, filed Jun. 4, 2019, titled "Accurate and Reliable OCP Test Methodology," which is hereby incorporated herein by reference in its entirety.

BACKGROUND

Many integrated circuits (ICs) include over-current protection (OCP). An OCP circuit is coupled to a functional circuit (e.g., a motor driver circuit), detects an output current from the functional circuit in excess of a threshold, and, in response, to the detected over-current status, reduces or shuts off the output current of the functional circuit to protect the load and/or IC driving the load. It is desirable to test the OCP circuit itself to determine the current magnitude at which the OCP circuit detects an over-current condition (its "trip point"). Determining the trip point permits devices to be screened for compliance with the devices' over-current specifications.

SUMMARY

In one example, a circuit includes a first transistor, a second transistor, and a sense transistor. The first current terminals of the first and second transistors are coupled together at a power supply node. The control terminals of the second and third transistors are coupled together. The second current terminals of the first, second, and third transistors are coupled together. The sense resistor is coupled between the first current terminals of the first and second transistors and the first current terminal of the third transistor. The first and second transistors are configured such that during a first mode of operation, current to a load flows through the first and second transistors, and during a second mode of operation, current to a load is discontinued through the first transistor yet flows through the second transistor.

BRIEF DESCRIPTION OF THE DRAWINGS

For a detailed description of various examples, reference will now be made to the accompanying drawings in which.

DETAILED DESCRIPTION

An OCP circuit includes a sense resistor through which flows a current proportional to the output current of the functional circuit flow. A voltage developed across the sense resistor is proportional to the output current. The sense resistor's voltage is provided to an input of a comparator, and a reference voltage (VREF_OCP) is provided to another input of the comparator. The output signal from the comparator indicates whether the sense resistor's voltage exceeds the reference voltage and thus whether the functional circuit is in an over-current state. An integrated circuit manufacturer may want to ensure the trip points of its devices are within a narrow range of a nominal value. For example, a device specification may be that the device has an over-current range of 10 A, that is, that the device will shut off its load current when the load current reaches a level of approximately 10 A. To that end, the trip point of the OCP circuit is determined to screen the devices.

One technique for testing an OCP circuit is to force an increase in the output current of the functional circuit to the point at which the OCP circuit's comparator trips g., from low to high) while separately monitoring the level of current the output current. A wafer normally includes multiple ICs, each with its own OCP circuit. Production testing of over-current protection circuits may occur at the wafer-level, that is, before the wafer is singulated into its individual ICs. Testing multiple ICs concurrently on a wafer requires large amounts of current, and thus may be infeasible. Concurrent testing of multiple ICs (post-packaging) also may require a large amount of current.

Figure 1:
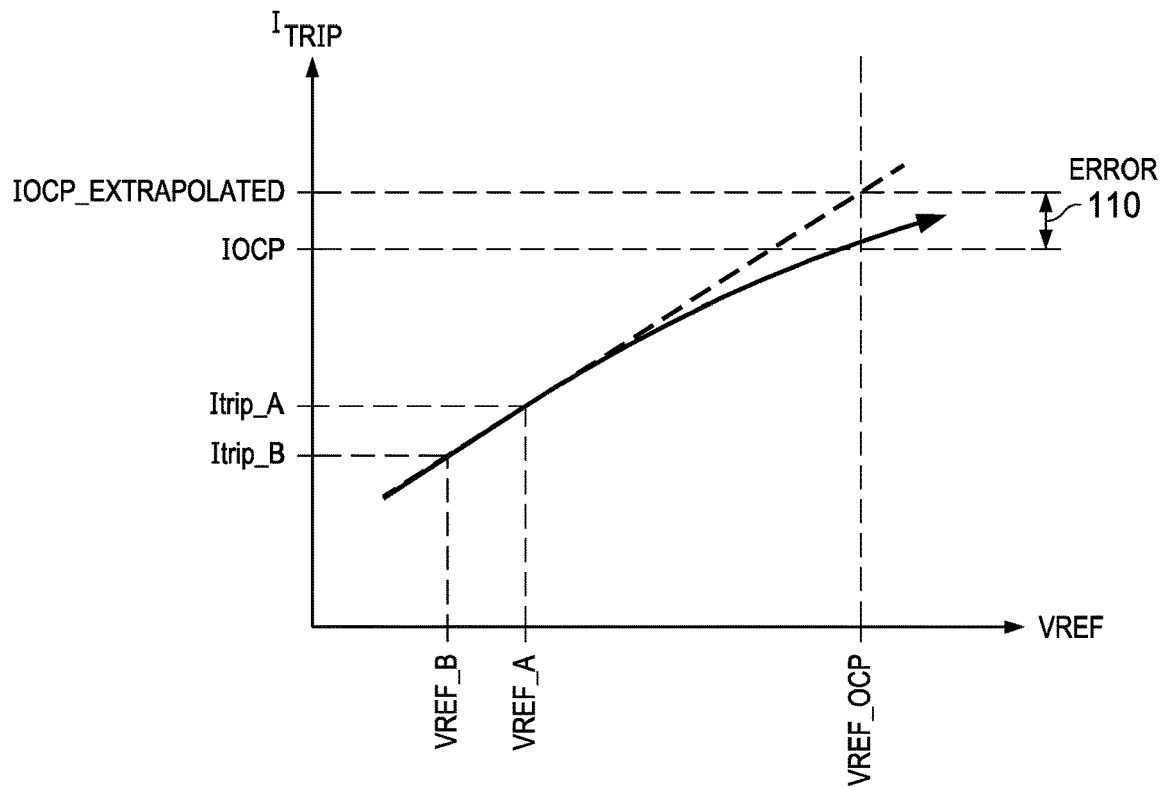
FIG. 1 illustrates a technique for determining the trip point of an over-current protection circuit through extrapolation of current measurements made at currents below the trip point.

FIG. 1 graphically illustrates another option to test each OCP circuit at two or more lower output current levels (e.g., Itrip_A and Itrip_B) while also providing commensurately lower reference voltages (VREF_A and VREF_B) to the comparator, and mathematically extrapolating to determine the output current at which the OCP circuit would trip during normal IC operation (IOCP_EXTRAPOLATED). However, due to the inherently non-linear current-voltage relationship of a transistor such as metal oxide semiconductor field effect transistor (MOSFET), extrapolating lower current level test results to determine the output current level at which the IC's OCP circuit will trip during normal operation (at reference voltage VREF_OCP) results in an error 110. The examples described herein implement a technique to test an OCP circuit at low test current levels while avoiding, or at least reducing, the error noted above.

Figure 2:
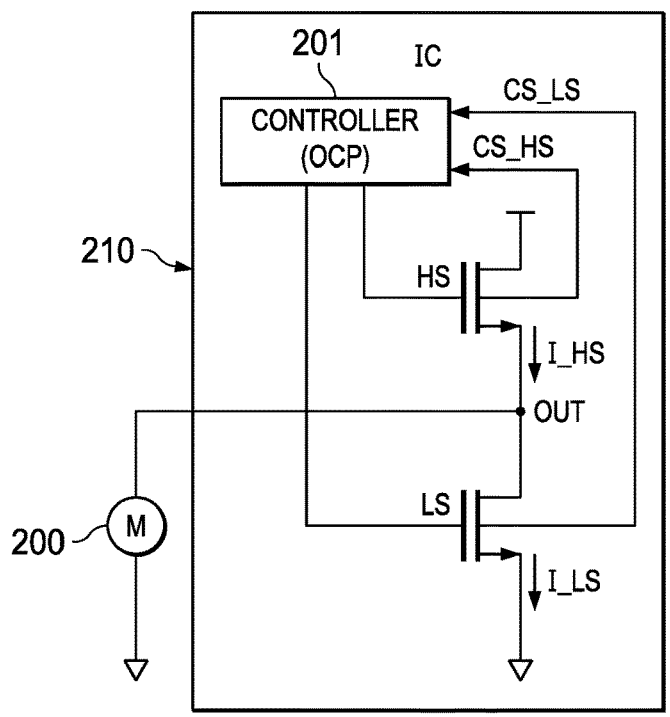
FIG. 2 shows an example integrated circuit with over-current protection for controlling a motor.

FIG. 2 illustrates a least a portion of an IC 200. In this example, the IC 200 includes a functional circuit for driving a motor 200. The functional circuit includes a high side (HS) transistor coupled to a low side (LS) transistor. A controller 201 with over-current protection controls the on/off state of the transistors. The transistors in this example comprise n-type MOSFET (NMOS) devices. The drain of the HS transistor is coupled to a supply voltage node (VM) and the source of the LS transistor is coupled to a ground node. The source of the HS transistor is coupled to the drain of the LS transistor at an output node (OUT). The output node can be coupled to a terminal of a motor 200 to thereby drive the motor. In this example, the load driven by IC 210 is a motor, but the load can be other types of devices in other examples.

The gates of the HS and LS transistors are controlled such that both transistors are not on simultaneously. That is, the HS transistor is turned on while the LS transistor is off, LS transistor is turned on while the HS transistor is off, or neither transistor is on. When the HS transistor is on, current I_HS flows through the HS transistor. When the LS transistor on, current I_LS flows through the LS transistor to ground. A sense circuit (shown in FIG. 3) senses the current through the HS and LS transistors and generates a corresponding current sense signal, CS_HS for the HS transistor and CS_LS for the LS transistor. The CS_HS and CS_LS current sense signals are fed back to the OCP circuit within control 201 and compared to corresponding thresholds to determine whether an over-current condition exists. The OCP circuit within controller 201 generates an over-current status signal (shown as the OCP_HS indication signal in FIG. 3) when I_HS exceeds an upper current limit. Similarly, the OCP circuit generates an OCP_LS indication signal when I_HS exceeds an upper current limit. Controller 201 responds to assertion of either or both of OCP_HS and OCP_LS indication signals in any suitable manner such as by forcing both transistors to be off.

Figure 3:
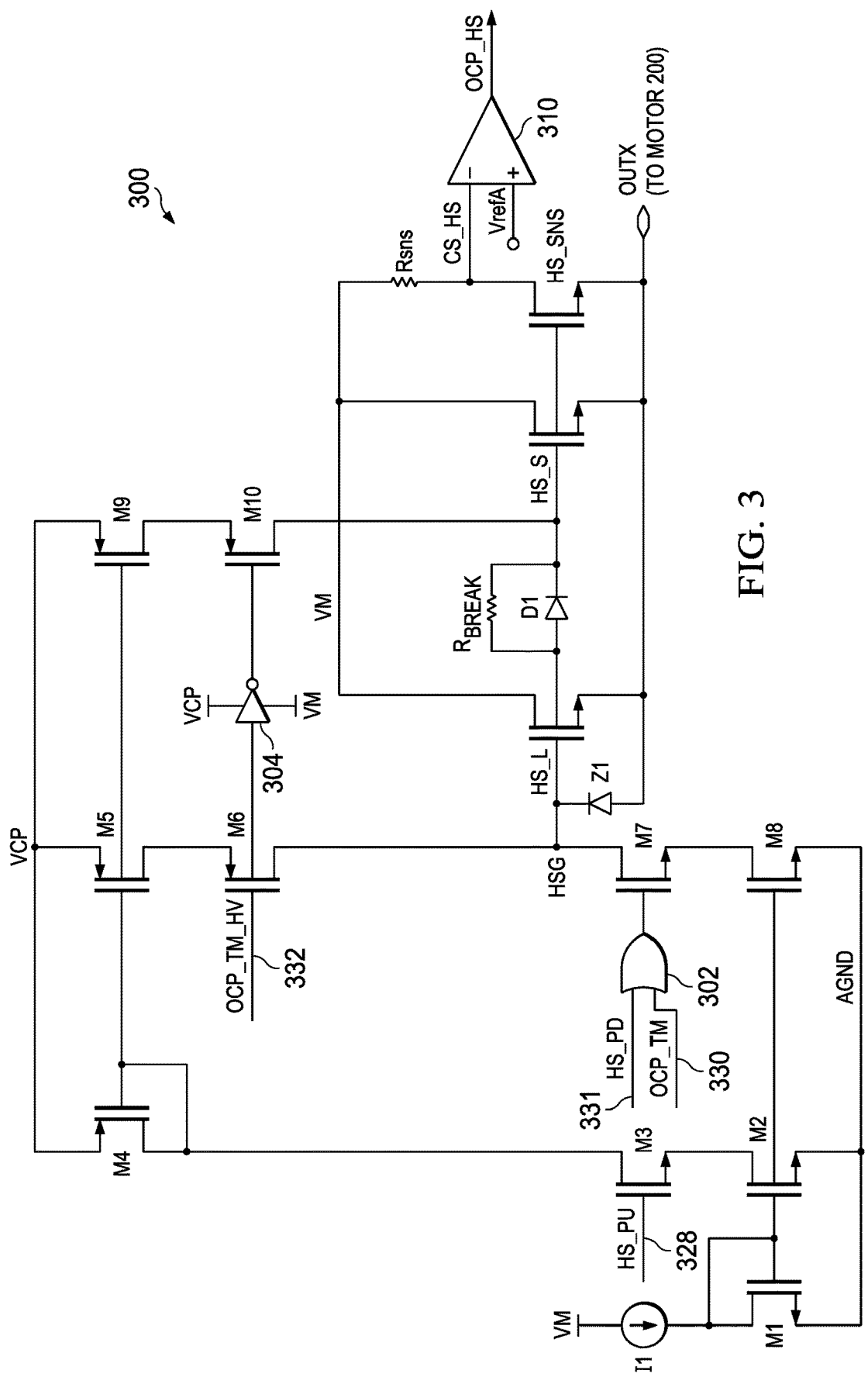
FIG. 3 shows an example implementation of at least a portion of the integrated circuit of FIG. 2 for a high side transistor.

FIG. 3 illustrates an example of a circuit 300 to (a) control the HS transistor during normal (i.e., non-OCP circuit testing) operation and (b) test the over-current protection for the HS transistor. Circuit 300 includes a current source I1, transistors M1-M10, an OR gate 302, an inverter 304, a diode D1, resistors Rbreak and Rsns, and a comparator 310. The HS transistor is shown in FIG. 3 as a combination of a larger MOSFET (HS_L) and a smaller MOSFET (HS_S). The size of the MOSFET is defined by the ratio of its channel width (W) to its channel length (L). The value of W/L is larger for HS_L than HS_S. In one example, W/L for HS_L is ten times as larger as W/L for HS_S. The controller 201 of FIG. 2 includes the components shown in FIG. 3 except HS_L, HS_S, HS_SNS, and Rsns. The combination of Rsns and HS HS_SNS comprises a sense circuit to generate a current sense signal to an input of comparator 310.

In the example of FIG. 3, M1-M3, M7, and M8 comprise NMOS transistors and M4-M6, M9, and M10 comprise p-type MOSFETs (PMOS). Current source I1 ("I1" refers both to the current source device as well as the magnitude of current it produces) is coupled to the drain of and gate of M1 The gates of M1, M2, and M8 are coupled together as are theft sources. As such, M1 and M2 forms a current mirror and M1 and M8 forms another current mirror. The drain of M2 is coupled to the source of M3 and the drains of M3 and M4 are coupled together. The gate of M3 is controlled by a control signal labeled HS_PU, When HS_PU is high (e.g., 5V), M3 is on, and when HS_PU is low (e.g., ground), M3 is off. As such, the current through M2 is mirrored from the current through M1 (I1) and M3 functions as a switch to turn on or off the mirrored current through M2.

The gates of M4, M5, and M9 are coupled together as are their sources. As such, M4 and M5 forms a current mirror and M4 and M9 also forms a current mirror. The drain of M5 is coupled to the source of M6, and the drains of M6 and M7 are coupled together at a node labeled HSG. The gate of HS_L is coupled to the node HSG. The source of M7 is coupled to the drain of M8. The drain of M9 is coupled to the source of M10, and the drain of M10 is coupled to the gate of HS_S. Rbreak is coupled across diode D1. The input of D1 is also coupled to node HSG. The output of D1 is coupled to the gates of HS_S and HS_SNS. The sources of HS_L, HS_S, and HS_SNS are coupled together at node OUTX, which represents the output node to be coupled to the load (e.g., motor 200). Zener Z1 is coupled between the gate and drain of HS_L and ensures that the gate-to-source voltage (Vgs) does not become so large as to damage HS_L, HS_S, and HS_SNS. The drains of HS_L and HS_S are coupled to supply voltage node VM. Rsns is coupled between VM and the drain of HS_SNS, The drain of HS_SNS is coupled to an inverting input of comparator 310. The voltage on the inverting input of comparator 310 is the high side current sense signal (CS_HS). The non-inverting input of comparator 310 is coupled to reference voltage VrefA. The output of comparator 310 provides the high side over current indication signal OCP_HS. HS_SNS is smaller than HS_S. In one example, HS_SNS is one-tenth the size of HS_SNS (i.e., its W/L is 10% the W/L of HS_S).

Any current through either or both of HS_L and HS_S represents the output current to the motor (I_HS of FIG. 2) and is mirrored through HS_SNS, albeit at a smaller level due to HS SNS being smaller than HS_L and HS_S. Rsns has a small resistance (e.g., 100 ohm) to generate a voltage across Rsns proportional to the output current to the motor. For an output current below the over-current threshold, the drain current HS_SNS is small enough that the voltage on the inverting input of comparator 310 will be greater than VrefA and thus OCP_HS will be logic low. In response to the output current through the combination of HS_S and HS_L being above the over-current threshold, the current HS_SNS will be larger enough such that the voltage on the comparator's inverting input will be below VrefA and the comparators output (OCP_HS) will be forced high.

The inputs to OR gate 302 include control signals OCP_TM 330 and HS_PD 331. HS_PD 331 is a signal that causes the HS transistor to be off (HS_PD being high causes M7 to be on thereby pulling down the gate voltage on HS_L/HS_S), OCP_TM 330 is low during normal operations and is asserted high during an over-current protection test mode. The gate of M6 and the input of inverter 304 are driven by OCP_TM_HV 332, which is a control signal that is asserted high during the over-current protection test mode and is low otherwise during normal operations). The power supply to inverter 304 is VCP and VM. VCP is a voltage that is higher than VM and may be produced in any suitable manner such as through the use of charge pump based on VM. As such, a logic high for OCP_TM_HV is VCP and a logic low is VM During normal operation (I.e., not during an over-current protection test mode), OCP_TM 330 and OCP_TM_HV 332 are logic low (e.g., OCP_TM 330 being at ground and OCP_TM_HV being at VM). HS_PD also is logic low, and thus M7 is in an off state thereby preventing current from flowing through M7 and M8. As explained above, at times, the HS transistor is on and at other times the HS transistor if off. When the HS transistor is to be turned on, HS_PU is forced high by control logic. HS_PU being high causes M3 to be turned on which permits current to flow through M4, M3, and M2. The current flowing through M4 M3, and M2 is mirrored from I1 via M1. The current through M4 also is mirrored through M5. With OCP_TM_HV being low, M6 is in an on state and the mirrored current through M5 also flows through M6 to the gate of HS_L to thereby charge the gate of HS_L turning it on. Through D1 and Rbreak HS_S also is turned on. Output current to the motor 200 thus flows through the combination of HS_L and HS_S. A proportional but much smaller current flow through Rsense and HS_SNS thereby generating a voltage on the inverting input of comparator 310. As explained above, the voltage across Rsns will be small enough that the voltage on the inverting input of comparator 310 will be above VrefA thereby forcing OCP_HS to be logic low. If the current through the combined paths of HS_L and HS_S is so large as to create a voltage drop across Rsns that is large enough to cause the voltage on the comparator's inverting input to fall below VrefA, OCP_HS is forced high.

During an over-current protection test mode, the trip point for the over-current protection is determined. The trip point occurs when the CS_HS voltage falls below VrefA, The over-current protection test mode determines the level of the output current to the motor 200 that results in CS_HS falling below VrefA. The controller 201 may receive an instruction from an external device over an interface to enter the over-current test mode.

During the over-current protection test mode, the control logic asserts OCP_TM 330 and OCP_TM_HV to their respective high levels (e.g., 5V for OCP_TM 330 and VCP for OCP_TM_HV 332). With OCP_TM_HV being high, MS is off thereby preventing current flow through M6. Further, HS_PU is forced high and remains high during the over-current protection circuit test mode. With HS_PU high, M3 is on and current flows through the circuit branch comprising M4, M3, and M2. Current flows through M4 but not through mirror pair transistor M5 due to MS being off. With OCP_TM 330 high, the output of OR gate 302 is high and M7 is on thereby providing a discharge path (biased by I1 through mirror pair M1 and M8) from the gate of HS_L through M7 and M8 to ground. As a result, HS_L is off.

With OCP_TM_HV being high, the output of inverter 304 will be low (e.g., at voltage VM) thereby turning on M10. Current thus flows through M9 and M10 into the gate of HS_S thereby turning on HS_S despite HS_L being off. The smaller HS_S (e.g., one-tenth the size of HS_L) is thus used during the over-current protection circuit test mode to determine the over-current level trip point. The same reference voltage, VrefA, is used for normal operation as well as for over-current test circuit mode operation, An external device can be coupled to OUTX to force an output current through HS_S that will result in a large enough current through sense resistor Rsns and HS_SNS so as to cause a large enough voltage drop across Rsns to force the voltage on the comparator's inverting input to drop below VrefA. As such, rather than the over-current test circuit mode being performed for a large current through HS_L (e.g., 10 A), the test mode is performed with a much smaller current through HS_S, with HS_L being off. A source meter/current sink can be used to draw current from HS_S. When HS_S is turned on during the overcurrent protection test node, the current level through HS_S is gradually increased until the over-current fault is registered (OCP_HS output of comparator 310 changes state). The overcurrent protection test may be performed prior to shipment of the IC to the customer.

Each of HS_L and HS_S is formed as multiple transistor "fingers" coupled together in parallel (e.g., drains coupled together and sources coupled together). Each of the fingers is fabricated to have the same W/L ratio. The test mode uses a transistor HS_S that is a known fraction (e.g., one-tenth) the size of the HS_L and the over-current trip point for normal operation can be determined to be a corresponding multiple of the current trip point when just the smaller HS_S is used. For example, if HS_S is one-tenth the size of HS_L, then the over-current trip point for normal operation is determined to be ten times the over-current trip point measured during the test mode. Because the finger W/L of HS_S is the same as the finger W/L of HS_L, the measurement of the over-current trip point occurs at the same drain-to-source voltage and the same overcurrent protection reference voltage (VrefA), and thus the non-linear nature of the FET current versus voltage characteristic is accounted in the measurement.

Figure 4:
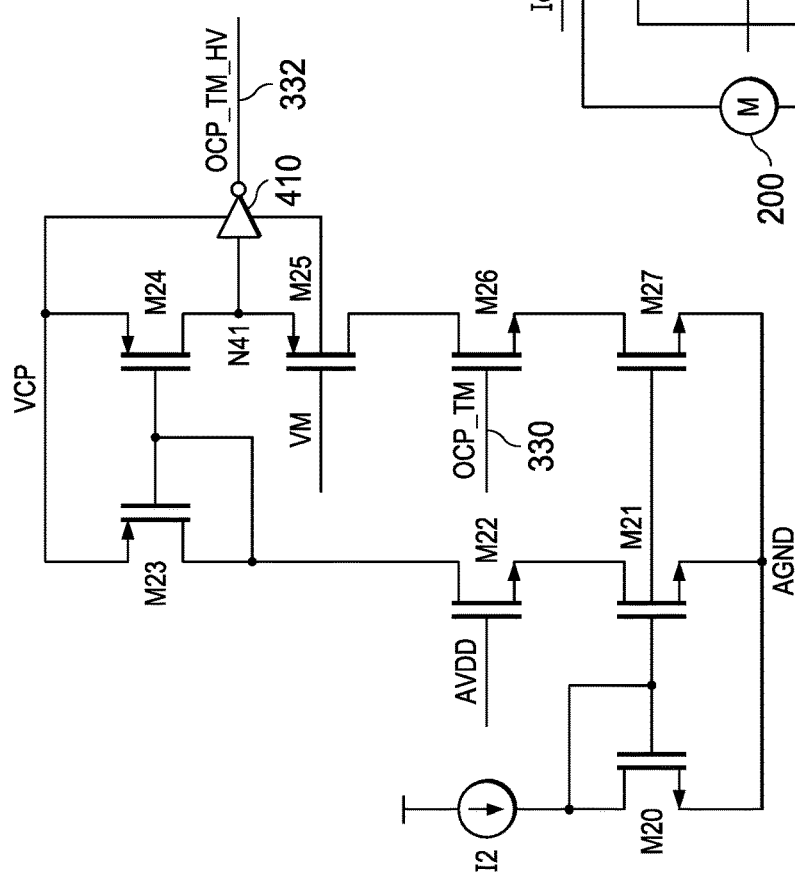
FIG. 4 shows an example circuit for generating one of the control signals used in the example of FIG. 3.

FIG. 4 shows a circuit to generate OCP_TM_HV 332 using OCP_TM 330. The circuit includes a current source I2, transistors M20-M27, and an inverter 410. In this example, M20-M22, M26, and M27 are NMOS transistors, and M23-M25 are PMOS transistors. M22 is biased on as AVDD is coupled to the gate of M22. I2 is coupled to the drain and gate of M20. The gates of M20, M21, and M27 are coupled together, as are their sources. As such, the current I2 through M20 is mirrored through M21, and when M126 is on, I2 also is mirrored through M27. The current mirror ratios of M20:M21 and of M20:M27 may be 1:1 or other than 1:1.

The source of M22 is coupled to the drain of M21. The drains of M22 and M23 are coupled together and to the gate of M23. The gates of M23 and M24 are coupled together. The sources of M23 and M24 are coupled together and to VCP. The positive and negative supply voltages to inverter 410 comprise VCP and VM, respectively. The drain of M24 is coupled to the source of M25 thereby defining node N41. The input of inverter 410 is coupled to node N41. VM is provided to the gate of M25. With its gate at VM, M25 is in an on state. The drains of M26 and M27 are coupled together, and the source of M26 is coupled to the drain of M27. The input Control signal OCP_TM turns on and off M26. When OCP_TM is low (which it is during normal operation), M26 is off. With M26 being off, the voltage on node N41 is pulled to VCP and the output (OCP_TM_HV 332) of inverter 410 is low (VM). During the over-current protection circuit test mode, OCP_TM 330 is asserted high and M26 is in its on state. With M26 being on, node N41 is pulled low (VM) and the output of inverter 410 (OCP_TM_HV 332) is asserted high (VCP).

Figure 5:
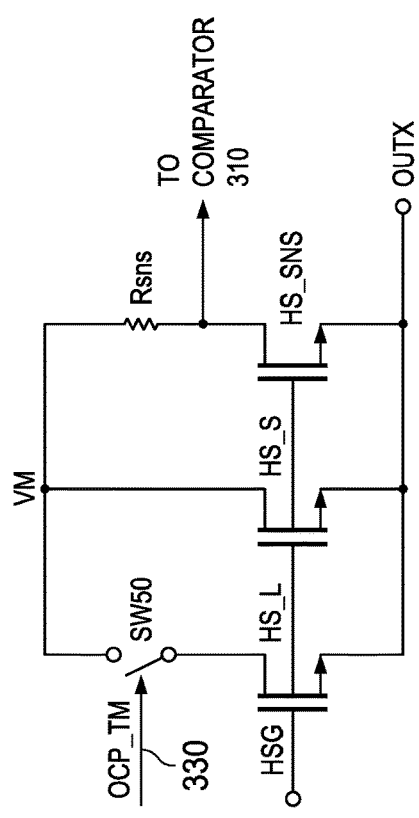
FIG. 5 shows another example of the implementation of the high side transistor.

FIG. 5 shows an example of a portion of the circuit of FIG. 3. In the example of FIG. 5, a switch SW50 is coupled between VM and the drain of HS_L rather than D1 and Rbreak between the gates of HS_L and HS_S. When open, SW50 prevents current flow through HS_L. SW50 is closed during the overcurrent protection test mode. In an alternative arrangement, rather than coupling SW50 between VM and the drain of HS_L, switch SW50 can be coupled between the source of HS_L and the output node, OUTX. The behavior of switch SW50 can also be implemented at probe-level testing for which separate probe pads are provided at the drains of HS_L and HS_S and by not connecting the probe to the drain of HS_L during over-current testing. During packaging, the pads can be connected to the same VM pin through different bond wires, hence a high threshold is achieved during normal operation.

Figure 6:
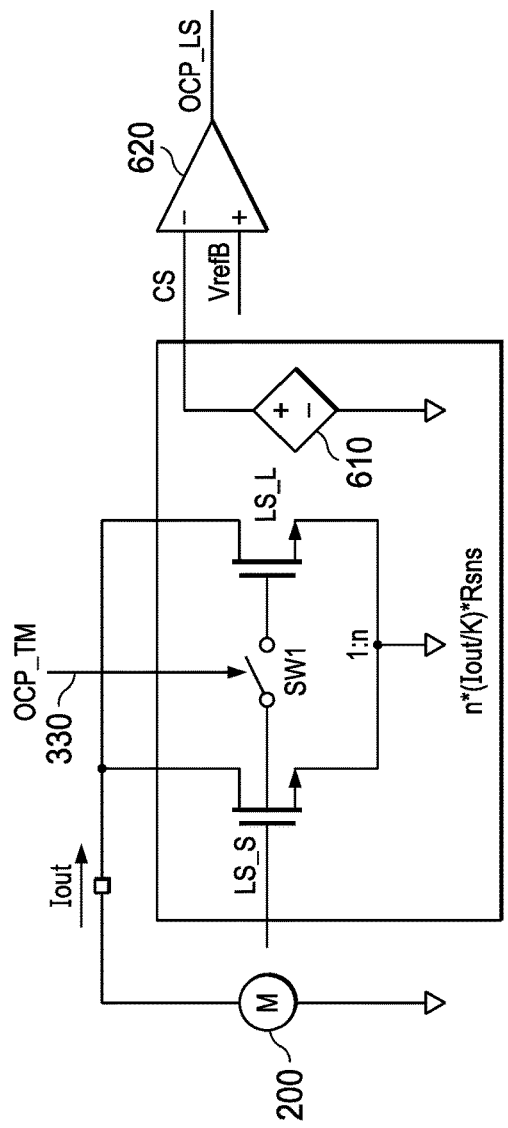
FIG. 6 shows an example implementation for determining the trip point of a low side transistor.

The circuit of FIGS. 3 and 5 are applicable to the high side transistor (HS). FIG. 6 shows an example circuit implementation for the low side transistor (LS). As was the case for the HS transistor, the LS transistor also is implemented as a larger transistor LS_L and a smaller transistor (LS_S). The sources of LS_L and LS_S are coupled together at a ground node, and their drains are also coupled and adapted to be coupled to motor 200. Voltage 610 represents the voltage developed across a sense resistor and sense transistor coupled to LS_S (in much the same way as shown in FIG. 3 for the high side transistor). The voltage (CS) from voltage 610 is proportional to the output current (Iout) and is given as n*(Iout/k)*Rsns, where "k" is the relative size ratio of LS_L to LS_S and Rsns is the resistance of the corresponding sense resistor. Voltage CS is provided to the inverting input of comparator 620. In much the same that OCP_HS is normally low and then transitions to a high state when the high side current exceeds an over-current limit, so too will OCP_LS normally be low and then transition to a high state when the low side current exceeds an over-current limit.

A switch, SW1, is coupled between the gate of LS_L and the gate of LS_S. When SW1 is closed (on), the voltage applied to the gate of LS_S is also applied to the gate of LS_L and thus transistors LS_L and LS_S are either both on or both off. SW1 is closed during normal operation responsive to OCP_TM 330 being low.

During the over-current protection test circuit mode, OCP_TM 330 is asserted high (as described above) which causes SW1 to be open. In this state, LS_L is off, but LS_S can be turned on via its gate signal to thereby use LS_S to determine the over-current trip point for comparator 620. The device containing the OCP circuit to be tested may be connected to a test fixture containing the output current-adjustable load. The testing of the device can be performed at the wafer level or after the device has been packaged into the final packaged integrated circuit. The trip point of the OCP circuit is performed at a test load current that is substantially smaller than the load current which will cause the OCP circuit to trip when the device is integrated into and end-user system. The test load current that trips the OCP circuit's comparator is then scaled using a scale factor related to the relative size difference of HS_L to HS_SNS. For example, if HS_L is 100 times larger than HS_SNS, then the test load current that trips the OCP circuit can be multiplied by 100 to determine the in-situ load current that will trip the OCP circuit when load current flows through HS_L.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Modifications are possible in the described embodiments, and other embodiments are possible, within the scope of the claims.

What is claimed is:

1. A circuit, comprising:
    a first transistor having a control input and first and second current terminals;
    a second transistor having a control input and first and second current terminals, the first current terminals of the first and second transistors coupled together at a first power supply node;
    a sense transistor having a control input and first and second current terminals, the control terminals of the second and sense transistors coupled together, the second current terminals of the first, second, and sense transistors coupled to an output of the circuit; and
    a sense resistor coupled between the first current terminals of the first and second transistors and the first current terminal of the sense transistor;
    wherein the first and second transistors are configured such that during a first mode of operation, current to a load flows through the first and second transistors, and during a second mode of operation, current to a load is discontinued through the first transistor and continues to flow through the second transistor.

2. The circuit of claim 1, further including a diode coupled between the control inputs of the first and second transistors.

3. The circuit of claim 2, wherein the diode has an anode and cathode, the anode is coupled to the control input of the first transistor and the cathode is coupled to the control input of the second transistor, and the circuit further includes a resistor coupled across the diode.

4. The circuit of claim 2, further including a fourth transistor coupled between a second power supply node and the control input of the second transistor.

5. The circuit of claim 4, wherein the second power supply node is configured to have a higher voltage than the first power supply node.

6. The circuit of claim 4, wherein the fourth transistor is configured to be off during the first mode of operation, and on during the second mode of operation.

7. The circuit of claim 1, wherein the first transistor has a size that is larger than a size of the second transistor.

8. The circuit of claim 1, further including a comparator having first and second inputs, the first input coupled to the first current terminal of the sense transistor and to the sense resistor, and the second input configured to receive a reference voltage.

9. A circuit, comprising:
    a first transistor having a control input and first and second current terminals;
    a second transistor having a control input and first and second current terminals, the first current terminals of the first and second transistors coupled together at a first power supply node, a size of the second transistor being smaller than a size of the first transistor;
    a sense transistor having a control input and first and second current terminals, the control terminals of the second and sense transistors coupled together, the second current terminals of the first, second, and sense transistors coupled to an output of the circuit;
    a sense resistor coupled between the first current terminals of the first and second transistors and the first current terminal of the sense transistor; and
    a comparator having first and second inputs, the first input coupled to the sense resistor, and the second input configured to receive a reference voltage;
    wherein the first and second transistors are configured such that during an overcurrent protection test mode, current does not flow through the first transistor and continues to flow through the second transistor and through the sense transistor and sense resistor.

10. The circuit of claim 9, further including a diode coupled between the control inputs of the first and second transistors.

11. The circuit of claim 10, wherein the diode has an anode and cathode, the anode coupled to the control input of the first transistor and the cathode coupled to the control input of the second transistor, and the circuit further includes a resistor coupled across the diode.

12. The circuit of claim 9, further including a fourth transistor coupled between a second power supply node and the control input of the second transistor.

13. The circuit of claim 12, wherein the second power supply node is configured to have a higher voltage than the first power supply node.

14. The circuit of claim 12, wherein the fourth transistor is configured to be off during the overcurrent protection test mode.

15. The circuit of claim 12, wherein, during a second mode of operation, the first, second, and sense transistors are configured to be on, and the fourth transistor is configured to be off.

16. The circuit of claim 12, wherein the circuit is a motor controller.

17. A circuit, comprising:
    a first transistor having a control input and first and second current terminals;

a second transistor having a control input and first and second current terminals, the first current terminals of the first and second transistors coupled together at a first power supply node;

a third transistor having a control input and first and second current terminals, the control terminals of the second and third transistors coupled together, the second current terminals of the first, second, and third transistors coupled to an output of the circuit, a size of the second transistor being smaller than a size of the first transistor and a size of the third transistor being smaller than the size of the second transistor;

a sense resistor coupled between the first current terminals of the first and second transistors and the first current terminal of the third transistor;

a diode coupled between the control inputs of the first and second transistors; and a comparator having first and second inputs, the first input coupled to the third transistor, and the second input configured to receive a reference voltage, an output of the comparator is configured to change state responsive to a voltage from the third transistor crossing the reference voltage;

wherein the first and second transistors are configured such that during an overcurrent protection test mode, current does not flow through the first transistor and continues to flow through the second transistor and through the third transistor and the sense resistor, and during a second mode, current flows through the first, second, and third transistors.

18. The circuit of claim 17, wherein the diode has an anode and cathode, the anode is coupled to the control input of the first transistor and the cathode is coupled to the control input of the second transistor, and the circuit further includes a resistor coupled across the diode.

19. The circuit of claim 17, further including a fourth transistor coupled between a second power supply node and the control input of the second transistor.

20. The circuit of claim 19, wherein the second power supply node is configured to have a higher voltage than the first power supply node.

* * * * *